(12) United States Patent
Wei et al.

(10) Patent No.: US 12,446,437 B2
(45) Date of Patent: Oct. 14, 2025

(54) DISPLAY PANEL, DRIVE METHOD THEREFOR, AND DISPLAY APPARATUS

(71) Applicant: BOE Technology Group Co., Ltd., Beijing (CN)

(72) Inventors: Junbo Wei, Beijing (CN); Shengji Yang, Beijing (CN); Kuanta Huang, Beijing (CN); Pengcheng Lu, Beijing (CN); Xiaochuan Chen, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 726 days.

(21) Appl. No.: 17/781,213

(22) PCT Filed: Jan. 5, 2021

(86) PCT No.: PCT/CN2021/070369
§ 371 (c)(1),
(2) Date: May 31, 2022

(87) PCT Pub. No.: WO2021/139659
PCT Pub. Date: Jul. 15, 2021

(65) Prior Publication Data
US 2022/0416214 A1   Dec. 29, 2022

(30) Foreign Application Priority Data
Jan. 6, 2020 (CN) .......................... 202010010834.6

(51) Int. Cl.
*H10K 59/50* (2023.01)
*H10K 50/844* (2023.01)
(Continued)

(52) U.S. Cl.
CPC .......... *H10K 59/50* (2023.02); *H10K 50/844* (2023.02); *H10K 50/858* (2023.02); *H10K 59/873* (2023.02); *H10K 59/879* (2023.02)

(58) Field of Classification Search
CPC ............... H10K 59/50; H10K 50/8445; H10K 59/8731; H10K 59/844
See application file for complete search history.

(56) References Cited

U.S. PATENT DOCUMENTS

2012/0049728 A1* 3/2012 Lee .................... H01J 9/241
445/25
2012/0250151 A1* 10/2012 Lee ..................... H04N 13/356
359/620
(Continued)

FOREIGN PATENT DOCUMENTS

CN    102253438 A   11/2011
CN    102736243 A   10/2012
(Continued)

OTHER PUBLICATIONS

CN-110098241-A Machine translation.*
(Continued)

*Primary Examiner* — Erik Kielin
(74) *Attorney, Agent, or Firm* — IPro, PLLC

(57) ABSTRACT

Disclosed are a display panel, a drive method therefor, and a display apparatus. By providing a light emergence angle adjustment structure (3) on a light emergence side of an organic light emitting device (12) and when an electric field is formed by applying different voltages on an electrode structure (31), on one respect, an electrical control material layer (32) of the light emergence angle adjustment structure (3) forms a convex lens structure under the action of the electric field, and the convex lens structure has the effect of concentrating an outputted light; and an another respect, the electrical control material layer (32) forms a concave lens structure under the action of the electric field, and the concave lens structure has the effect of dispersing an outputted light.

20 Claims, 8 Drawing Sheets

(51) Int. Cl.
*H10K 50/858* (2023.01)
*H10K 59/80* (2023.01)

(56) References Cited

U.S. PATENT DOCUMENTS

| | | |
|---|---|---|
| 2013/0235442 A1 | 9/2013 | Seike |
| 2014/0132724 A1 | 5/2014 | Choi et al. |
| 2016/0077328 A1* | 3/2016 | Chong .............. G02F 1/133526 359/291 |
| 2018/0203271 A1* | 7/2018 | Wang ..................... H10K 59/50 |
| 2021/0226160 A1* | 7/2021 | Zhao ..................... G06F 3/0412 |

FOREIGN PATENT DOCUMENTS

| | | |
|---|---|---|
| CN | 104160318 A | 11/2014 |
| CN | 105223710 A | 1/2016 |
| CN | 108873312 A | 11/2018 |
| CN | 110098241 A | 8/2019 |
| CN | 110727103 A | 1/2020 |
| CN | 111640879 A | 9/2020 |

OTHER PUBLICATIONS

CN202010010834.6 first office action.
CN202010010834.6 second office action.
PCT/CN2021/070369 international search report.

* cited by examiner

| Electrical control material layer | — 32 ⎫ |
|---|---|
| Electrode structure | — 31 ⎭ 3 |
| Display substrate | — 1 |

Fig. 1

| Electrode structure | — 31 ⎫ |
|---|---|
| Electrical control material layer | — 32 ⎭ 3 |
| Display substrate | — 1 |

Fig. 2

| Electrical control material layer | — 32 ⎫ |
|---|---|
| Second electrode layer | — 312 ⎫ 3 |
| Insulating layer | — 313 ⎬ 31 |
| First electrode layer | — 311 ⎭ |
| Display substrate | — 1 |

Fig. 3

DISPLAY PANEL, DRIVE METHOD THEREFOR, AND DISPLAY APPARATUS

CROSS REFERENCE TO RELATED APPLICATIONS

The present application is a US National Stage of International Application No. PCT/CN2021/070369, filed on Jan. 5, 2021, which claims priority to Chinese Patent Application No. 202010010834.6, filed to the China Patent Office on Jan. 6, 2020 and entitled "DISPLAY PANEL, DRIVE METHOD THEREFOR, AND DISPLAY APPARATUS", the entire contents of which are incorporated herein by reference.

FIELD

The present application relates to the field of display, in particular to a display panel, a drive method therefor, and a display apparatus.

Background

Organic light emitting diodes (OLEDs) are one of the hotspots in the field of research on flat panel displays at present, among which silicon-based OLEDs are a new type of OLED display apparatuses based on silicon substrates. The silicon-based OLEDs have the characteristics of high pixels per inch (PPI), small size and high contrast, and are made by a mature integrated circuit complementary metal oxide semiconductor (CMOS) process, which achieves active addressing of pixels. The silicon-based OLEDs also have timer controls (TCONs), one time programmable (OTP) chips and other circuits to achieve lightweight. The silicon-based OLEDs are widely used in the fields of near-to-eye display, virtual reality (VR), and augmented reality (AR), especially in AR/VR head-mounted display apparatuses. With the development of the big data and information interaction technology, the virtual reality technology is widely applied and popularized. The VR technology is a human-computer interaction 3D dynamic scene reconstruction technology that integrates a variety of information and technologies, through which users may engage themselves in the virtual environment and immerse themselves in the virtual simulation scene. The immersion of the user needs to be improved to improve the human-computer interaction experience of a VR display apparatus, which is also a technical difficulty of VR technology innovation. With the rapid development of the information technology, as an information carrier, a display screen needs a light emitting conversion display technology to meet the needs of special display.

SUMMARY

Embodiments of the present application provide a display panel, a drive method therefor, and a display apparatus. The specific solution is as follows.

An embodiment of the present application provides a display panel, including: a display substrate, and at least one light emitting angle adjustment structure located on a light emitting side of the display substrate; where the at least one light emitting angle adjustment structure includes an electrode structure and an electrical control material layer which are disposed in a laminated manner; the electrical control material layer is configured to form a convex lens structure or a concave lens structure under the action of an electric field, and is a flat mirror structure when there is no action of an electric field; and the electrode structure is configured to form an electric field when a voltage is applied, to enable the electrical control material layer to form the convex lens structure or the concave lens structure under the action of the electric field.

Optionally, in the specific implementation, in the above display panel provided by the embodiment of the present application, a material of the electrical control material layer includes polycarbonate plexiglass, polyvinylidene fluoride or an electrowetting material.

Optionally, in the specific implementation, in the above display panel provided by the embodiment of the present application, the electrode structure includes a first electrode layer, an insulating layer, and a second electrode layer which are disposed in a laminated manner; where the electrode structure is located on a side, close to the display substrate, of the electrical control material layer; or the electrode structure is located on a side, away from the display substrate, of the electrical control material layer.

Optionally, in the specific implementation, in the above display panel provided by the embodiment of the present application, the electrode structure includes a first electrode layer and a second electrode layer which are disposed in a laminated manner, and the electrical control material layer is located between the first electrode layer and the second electrode layer.

Optionally, in the specific implementation, in the above display panel provided by the embodiment of the present application, the first electrode layer is a planar electrode, and the second electrode layer includes a plurality of independently disposed block electrodes; or, the first electrode layer includes a plurality of independently disposed block electrodes, and the second electrode layer is a planar electrode; or, the first electrode layer and the second electrode layer each include a plurality of independently disposed block electrodes.

Optionally, in the specific implementation, in the above display panel provided by the embodiment of the present application, the first electrode layer and the second electrode layer are each a transparent conductive material.

Optionally, in the specific implementation, the above display panel provided by the embodiment of the present application includes pixel units distributed in an array; where the pixel units are in one-to-one correspondence with light emitting angle adjustment structures, or a plurality of pixel units correspond to one light emitting angle adjustment structure, or all the pixel units correspond to one light emitting angle adjustment structure.

Optionally, in the specific implementation, in the above display panel provided by the embodiment of the present application, the display substrate includes a base substrate and an organic light emitting device located on the base substrate; and the organic light emitting device includes an anode, an organic light emitting layer, and a cathode which are disposed in a laminated manner.

Optionally, in the specific implementation, the above display panel provided by the embodiment of the present application further includes a second film encapsulation layer located on a side, facing away from the display substrate, of the at least one light emitting angle adjustment structure, and a cover plate located on a side, facing away from the display substrate, of the second film encapsulation layer.

Optionally, in the specific implementation, the above display panel provided by the embodiment of the present application further includes a first protective layer located between the display substrate and the at least one light emitting angle adjustment structure.

Optionally, in the specific implementation, the above display panel provided by the embodiment of the present application further includes a second protective layer located between the second film encapsulation layer and the at least one light emitting angle adjustment structure.

Optionally, in the specific implementation, in the above display panel provided by the embodiment of the present application, the base substrate is a silicon substrate.

Optionally, in the specific implementation, the above display panel provided by the embodiment of the present application further includes a drive circuit configured to apply a drive voltage to the electrode structure, where the drive circuit is independent of the silicon substrate, or the drive circuit is integrated in the silicon substrate.

Correspondingly, an embodiment of the present application further provides a display apparatus, including any display panel provided by the embodiments of the present application.

Correspondingly, an embodiment of the present application further provides a drive method for any display panel provided by the embodiments of the present application. The drive method includes: applying a voltage to an electrode structure to form an electric field, to enable an electrical control material layer to form a convex lens structure or a concave lens structure under the action of the electric field.

Optionally, in the specific implementation, when the electrode structure includes a first electrode layer and a second electrode layer, the above drive method provided by the embodiments of the present application includes the following: in a narrow viewing angle mode: a voltage is applied to the first electrode layer and the second electrode layer to form a first electric field pointing to a center of the display panel along both sides of the display panel and having a gradually increasing electric field intensity, to enable the electrical control material layer to form the convex lens structure under the action of the first electric field; in a wide viewing angle mode: a voltage is applied to the first electrode layer and the second electrode layer to form a second electric field opposite to a direction of the first electric field, to enable the electrical control material layer to form the concave lens structure under the action of the second electric field; and in a normal display mode: there is no voltage difference between the first electrode layer and the second electrode layer, where the electrical control material layer is a flat mirror structure.

BRIEF DESCRIPTION OF THE DRAWINGS

FIG. 1 is a first schematic structural diagram of a display panel according to an embodiment of the present application.

FIG. 2 is a second schematic structural diagram of a display panel according to an embodiment of the present application.

FIG. 3 is a third schematic structural diagram of a display panel according to an embodiment of the present application.

DETAILED DESCRIPTION OF THE EMBODIMENTS

Figure 4:
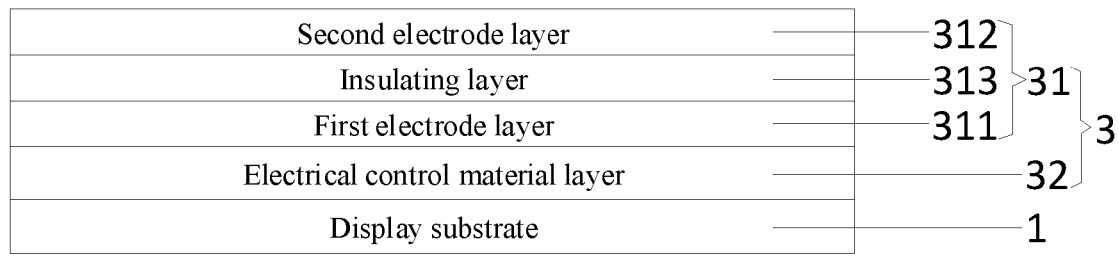
FIG. 4 is a fourth schematic structural diagram of a display panel according to an embodiment of the present application.

In order to make the purpose, technical solutions and advantages of the present application clearer, a display panel, a drive method therefor, and a display apparatus provided by the present application will be described in further detail below in conjunction with the accompanying drawings. It will be apparent that described embodiments are only a part of embodiments of the present application, rather than all embodiments. Based on the embodiments in the present application, all other embodiments obtained by those of ordinary skill in the art without creative work fall within the protection scope of the present application.

The shapes and sizes of components in the accompanying drawings do not reflect the real scale of the display panel, and the purpose is only to illustrate the content of the present application.

As shown in FIG. 1 and FIG. 2, the display panel provided by the embodiments of the present application includes: a display substrate 1, and at least one light emitting angle adjustment structure 3 located on a light emitting side of the display substrate 1. The at least one light emitting angle adjustment structure 3 includes an electrode structure 31 and an electrical control material layer 32 which are disposed in a laminated manner. The electrical control material layer 32 is configured to form a convex lens structure or a concave lens structure under the action of an electric field, and is a flat mirror structure when there is no electric field. The electrode structure 31 is configured to form an electric field when a voltage is applied, so that the electrical control material layer 32 forms the convex lens structure or the concave lens structure under the action of the electric field.

According to the display panel provided by the embodiments of the present application, by providing the at least one light emitting angle adjustment structure 3 on the light emitting side of the display substrate 1, when the electric field is formed by applying different voltages on the electrode structure 31 of the at least one light emitting angle adjustment structure 3, in a first aspect, the electrical control material layer 32 of the light emitting angle adjustment structure 3 forms the convex lens structure under the action of the electric field, the convex lens structure has the effect of concentrating output light, and therefore, the electrical control material layer 32 may decrease the divergence angle of the light emitted from the display panel, so as to decrease the viewing angle of the display apparatus, and achieve anti-peep display. In another aspect, the electrical control material layer 32 of the light emitting angle adjustment structure 3 forms the concave lens structure under the action of the electric field, the concave lens structure has the effect of dispersing output light, and therefore, the electrical control material layer 32 may increase the divergence angle of the light emitted from the display panel, so as to increase the viewing angle of the display apparatus, and achieve wide viewing angle display. Moreover, the electrical control material layer 32 of the light emitting angle adjustment structure 3 is the flat mirror structure when there is no action of an electric field, thereby achieving the function of normal display. Therefore, the display panel provided by the embodiments of the present application can realize the adjustable light emitting angle of display while displaying images, to enhance the stereo display effect of images, and improve the immersion and experience of users, thereby achieving a high-quality near-to-eye display effect.

It should be noted that the display substrate in the present application may be any device with a display function, such as a liquid crystal display (LCD), an organic light-emitting diode (OLED) display, a light emitting diode (LED) display, a plasma display panel (DPD), and a cathode ray tube (CRT) display, which is not limited here.

In the light emitting angle adjustment structure, the electrical control material layer may be made of two types of electrical control materials with different refractive indices, so that different electric fields are formed at different positions of the electrode structure by applying a voltage to the electrode structure; and the electrical control material layer has different deformations at different positions under the action of the electric fields. Therefore, the electrical control material layer is controlled to deform into the convex lens structure or the concave lens structure by controlling the voltage applied to the electrode structure, so as to achieve control over the light emitting angle.

In the specific implementation, in the above display panel provided by the embodiments of the present application, the material of the electrical control material layer may include polycarbonate plexiglass, polyvinylidene fluoride, or an electrowetting material.

When the material of the electrical control material layer includes polycarbonate plexiglass, since polycarbonate plexiglass is biaxially stretched oriented plexiglass, the toughness of the electrical control material layer made of polycarbonate plexiglass may be greatly enhanced. Different electric fields are formed at different positions of the electrode structure by transmitting different voltages to the electrode structure, and the electrical control material layer has different deformations at different positions under the action of the electric fields. Therefore, the electrical control material layer is controlled to deform into the convex lens structure or the concave lens structure by controlling the magnitude of the voltage applied to the electrode structure, so as to achieve control over the light emitting angle.

When the material of the electrical control material layer includes polyvinylidene fluoride, since polyvinylidene fluoride is a piezoelectric material, different electric fields are formed at different positions of the electrode structure by applying different voltages to the electrode structure, and the electrical control material layer has different deformations at different positions under the action of the electric fields. Therefore, the electrical control material layer is controlled to deform into the convex lens structure or the concave lens structure by controlling the magnitude of the voltage applied to the electrode structure, so as to achieve control over the light emitting angle.

When the material of the electrical control material layer includes the electrowetting material, the wettability of droplets of the electrical control material layer on the electrode structure is different by applying different voltages to the electrode structure, that is, droplets of the electrical control material layer have different contact angles with different positions of the electrode structure. Therefore, the electrical control material layer is made to be the convex lens structure or the concave lens structure by changing the contact angles between the droplets of the electrical control material layer and the different positions of the electrode structure according to the applied voltages, so as to achieve control over the light emitting angle.

Further, in the specific implementation, in the above display panel provided by the embodiments of the present application, as shown in FIG. 3 and FIG. 4, the electrode structure 31 may include a first electrode layer 311, an insulating layer 313, and a second electrode layer 312 which are disposed in a laminated manner.

As shown in FIG. 3, the electrode structure 31 may be located on a side, close to the display substrate 1, of the electrical control material layer 32. Or, as shown in FIG. 4, the electrode structure 31 may also be located on a side, away from the display substrate 1, of the electrical control material layer 32.

Figure 5:
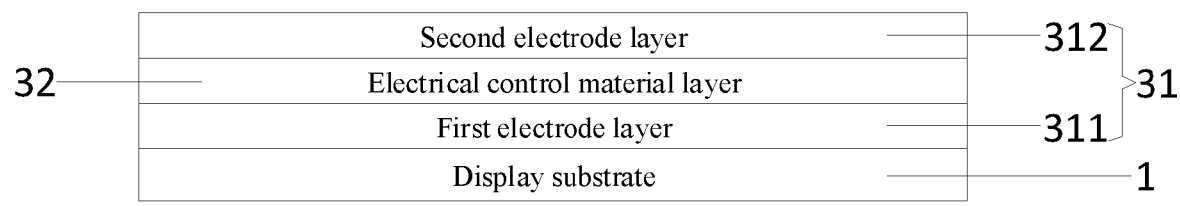
FIG. 5 is a fifth schematic structural diagram of a display panel according to an embodiment of the present application.

Further, in the specific implementation, in the above display panel provided by the embodiments of the present application, as shown in FIG. 5, the electrode structure 31 may include a first electrode layer 311 and a second electrode layer 312 which are disposed in a laminated manner, and the electrical control material layer 32 may be located between the first electrode layer 311 and the second electrode layer 312.

Figure 6:
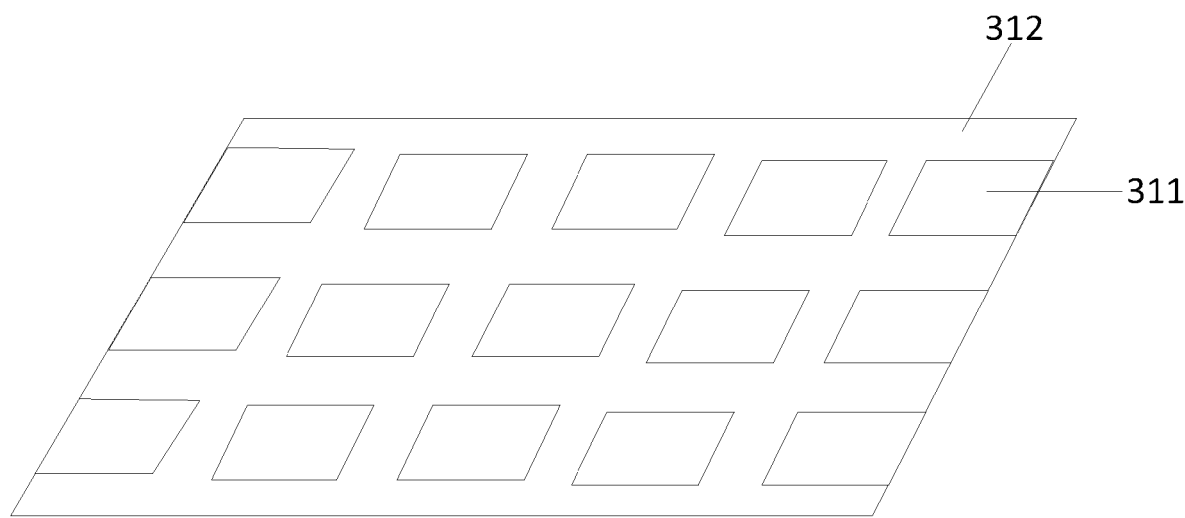
FIG. 6 is a first schematic diagram of an electrode structure according to an embodiment of the present application.
Figure 7:
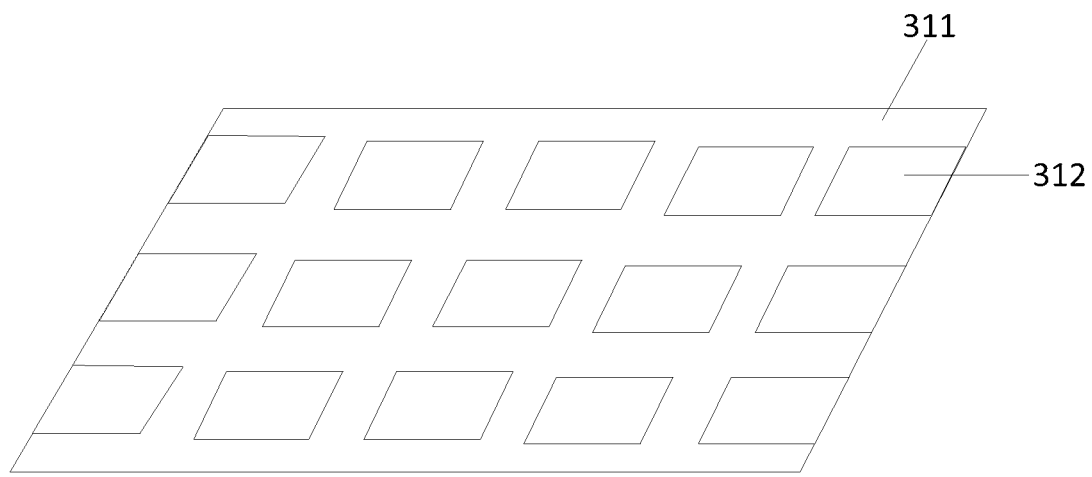
FIG. 7 is a second schematic diagram of an electrode structure according to an embodiment of the present application.

Further, in the specific implementation, in the above display panel provided by the embodiments of the present application, as shown in FIG. 6, the first electrode layer 311 may be a planar electrode disposed on the entire surface, and the second electrode layer 312 may include a plurality of independently disposed block electrodes. Or, as shown in FIG. 7, the first electrode layer 311 may include a plurality of independently disposed block electrodes, and the second electrode layer 312 may be a planar electrode disposed on the entire surface. Or, as shown in FIG. 8, the first electrode layer 311 and the second electrode layer 312 may each include a plurality of independently disposed block electrodes.

Figure 8:
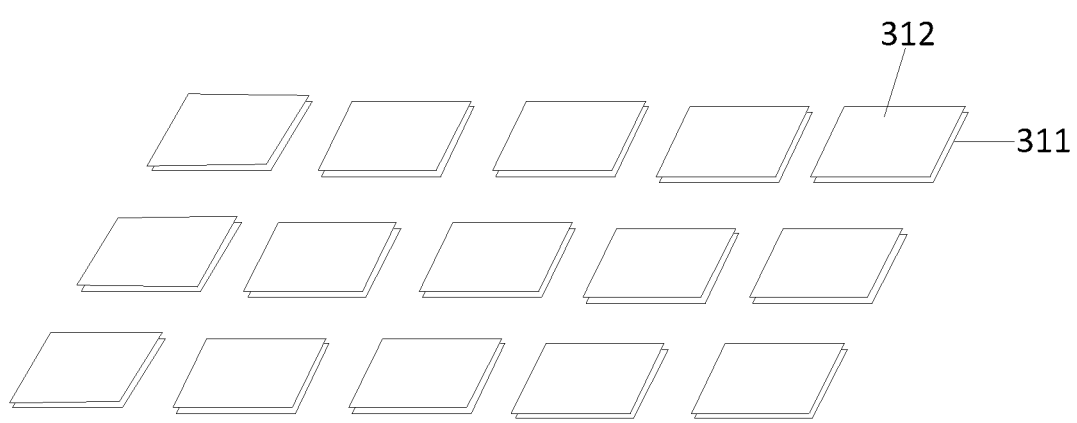
FIG. 8 is a third schematic diagram of an electrode structure according to an embodiment of the present application.

It should be noted that the structures shown in FIGS. 6 to 8 are only to illustrate the structures of the first electrode layer 311 and the second electrode layer 312. When the electrode structure 31 shown in FIG. 3 or FIG. 4 is adopted, there is also the insulating layer 313 (not shown in FIG. 6 and FIG. 7) between the first electrode layer 311 and the second electrode layer 312 shown in FIG. 6 and FIG. 7. When the electrode structure 31 shown in FIG. 5 is adopted, there is also the electrical control material layer 32 (not shown in FIG. 8) between the first electrode layer 311 and the second electrode layer 312 shown in FIG. 8.

Figure 9:
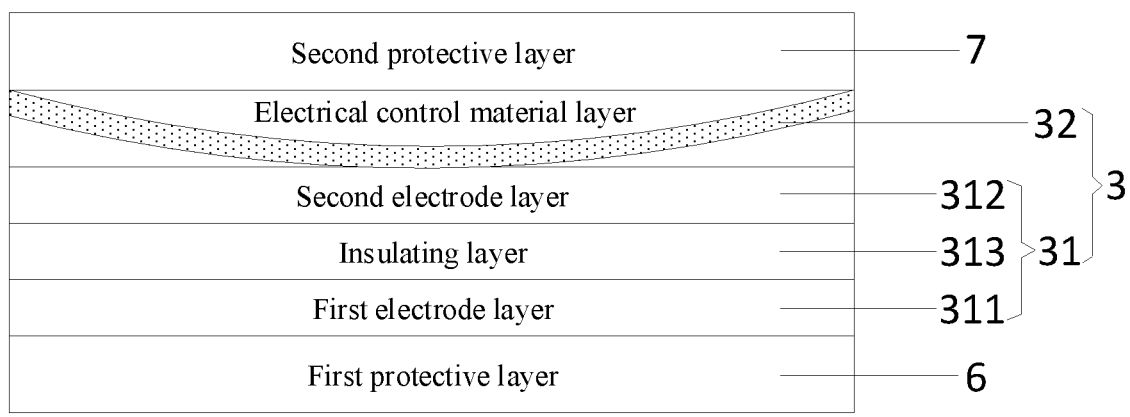
FIG. 9 is a schematic structural diagram of a display panel with an electrical control material layer being a concave lens according to an embodiment of the present application.

Taking the electrical control material layer being made of the polycarbonate plexiglass material as an example and in conjunction with the structure shown in FIG. 3, when the first electrode layer 311 is a planar electrode disposed on the entire surface, and the second electrode layer 312 includes a plurality of independently disposed block electrodes, a voltage is applied to the planar electrode of the first electrode layer 311, and different voltages are applied to the plurality of independently disposed block electrodes of the second electrode layer 312. For example, voltages applied to the block electrodes gradually increase from both sides of the display panel to the center of the display panel, so that formed electric fields gradually increase from both sides of the display panel to the center of the display panel, that is, different electric fields are formed at different positions of the electrode structure 3. The electrical control material layer 32 is controlled to have concave or convex deformation correspondingly by controlling the applied voltage, so as to achieve control over the light emitting angle. For example, as shown in FIG. 9, the first electrode layer 311 may be grounded (or a public voltage is loaded); and positive voltages are applied to all block electrodes of the second electrode layer 312, and gradually increase from both sides of the display panel to the center of the display panel. The electrical control material layer 32 has different deformations under different voltages, so that the electrical control material layer 32 forms a semi-circular arc shape via the changed electric field force between the first electrode layer 311 and the second electrode layer 312, and the electrical control material layer 32 protrudes toward the display substrate 1 to form a concave lens. The concave lens structure has the effect of dispersing output light, and therefore, the electrical control material layer 32 may increase the divergence angle of the light emitted from the display panel, so as to increase the viewing angle of the display apparatus, and may achieve wide viewing angle display.

Figure 10:
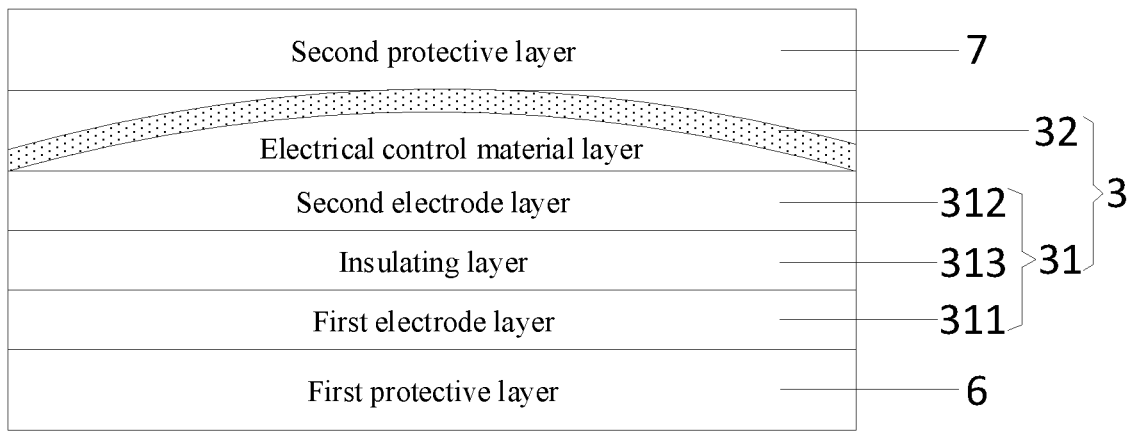
FIG. 10 is a schematic structural diagram of a display panel with an electrical control material layer being a convex lens according to an embodiment of the present application.

As shown in FIG. 10, the first electrode layer 311 may be grounded (or a public voltage is loaded); and negative voltages are applied to all block electrodes of the second electrode layer 312, and gradually decrease from both sides of the display panel to the center of the display panel. The electrical control material layer 32 has different deformations under different voltages, so that the electrical control material layer 32 forms a semi-circular arc shape via the changed electric field force between the first electrode layer 311 and the second electrode layer 312, and the electrical control material layer 32 protrudes away from the display substrate 1 to form a convex lens. The convex lens structure has the effect of concentrating output light, and therefore, the electrical control material layer 32 may decrease the divergence angle of the light emitted from the display panel, so as to decrease the viewing angle of the display apparatus, and may achieve anti-peep display. For example, no voltage is applied to the first electrode layer 311 and the second electrode layer 312, so that the electrical control material layer 32 is a transparent flat mirror structure, so as to achieve the function of normal display. Therefore, pixel images of the OLED display apparatus achieve adjustment of the viewing angle on a display screen under the action of the light emitting angle adjustment structure 3, the viewing angle adjustment function of the display apparatus is improved, and thus the matching degree of the display apparatus is improved.

It should be noted that the above driving principle is illustrated with the first electrode layer 311 being a planar electrode disposed on the entire surface and the second electrode layer 312 including a plurality of independently disposed block electrodes as an example. It will be apparent that in the specific implementation, the first electrode layer 311 may include a plurality of independently disposed block electrodes, and the second electrode layer 312 may be a planar electrode disposed on the entire surface; or the first electrode layer 311 and the second electrode layer 312 may each include a plurality of independently disposed block electrodes. The three different electrode structures have the same driving principle, which will not be repeated here.

It should be noted that the above driving principle of the present application is illustrated with the structure shown in FIG. 3, and in the specific implementation, when the structure shown in FIG. 4 is adopted, the driving principle for concave or convex deformation of the electrical control material layer 32 is the same as that of the structure shown in FIG. 3. In addition to the only difference that the positions of the electrical control material layer 32 are different, FIG. 4 and FIG. 3 have the same driving principle, which will not be repeated here.

In the specific implementation, when the structure shown in FIG. 5 is adopted, the structure of the first electrode layer 311 and the second electrode layer 312 is the same as that shown in FIG. 3 or FIG. 4. In addition to the difference that the electrical control material layer 32 is disposed between the first electrode layer 311 and the second electrode layer 312 in FIG. 5, the driving principle in FIG. 5 is the same as that in FIG. 3 or FIG. 4, that is, the electrical control material layer 32 may have different deformations at different positions to form a concave lens or a convex lens by applying different voltages to the block electrodes pointing to the center of the display panel along both sides of the display panel, that is, the concave or convex deformation of the electrical control material layer 32 is achieved by controlling the applied voltages, which will not be described in detail here.

Further, in the specific implementation, in the above display panel provided by the embodiments of the present application, as shown in FIGS. 3 to 5, the first electrode layer 311 and the second electrode layer 312 are each made of a transparent conductive material in order to increase the transmittance of the display panel. Specifically, the transparent conductive material may be indium tin oxide (ITO), indium zinc oxide (IZO), or the like.

Figure 11:
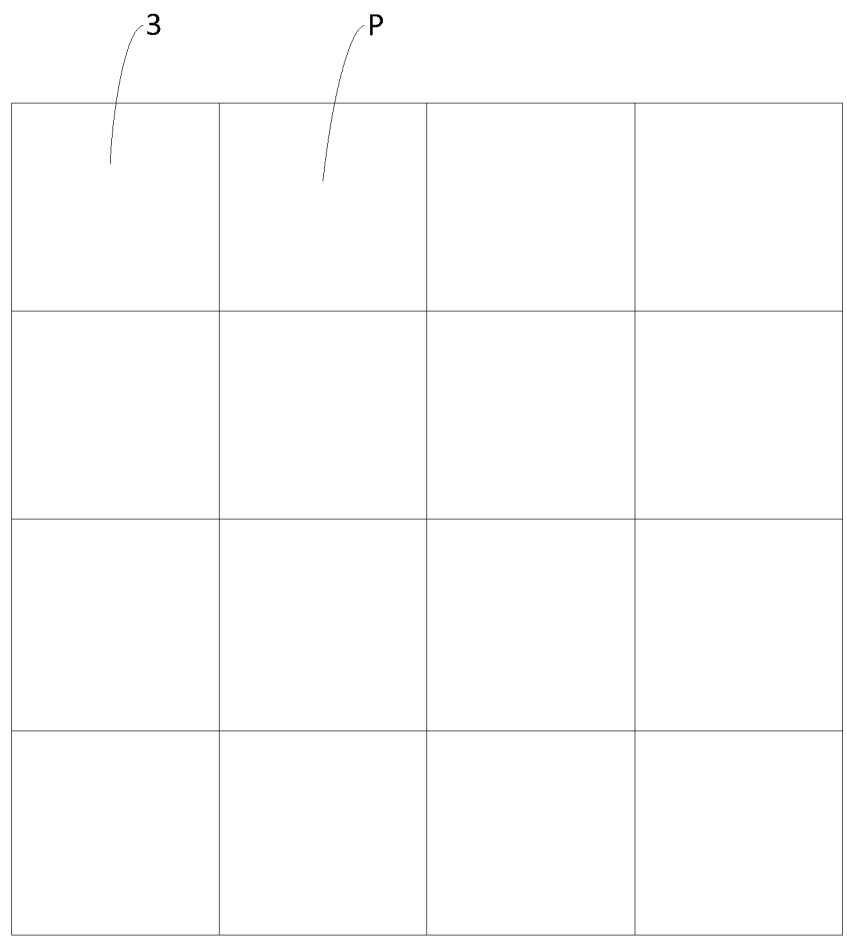
FIG. 11 is a first structural schematic diagram of correspondence of pixel units and a light emitting angle adjustment structure in a display panel according to an embodiment of the present application.
Figure 12:
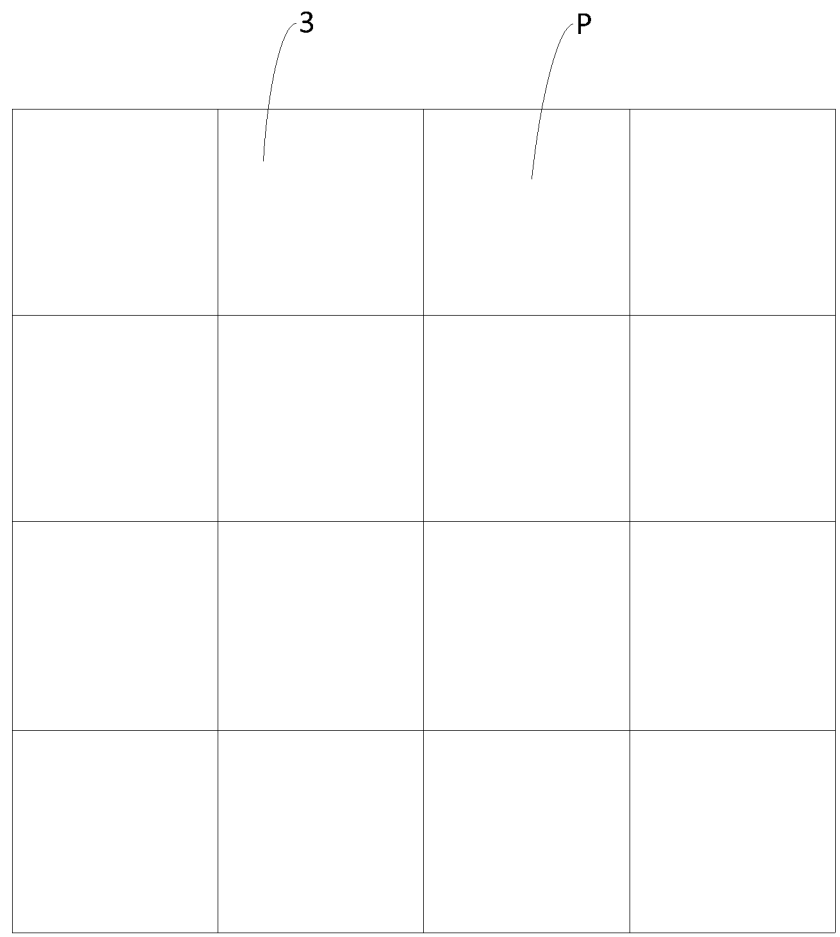
FIG. 12 is a second structural schematic diagram of correspondence of pixel units and a light emitting angle adjustment structure in a display panel according to an embodiment of the present application.
Figure 13:
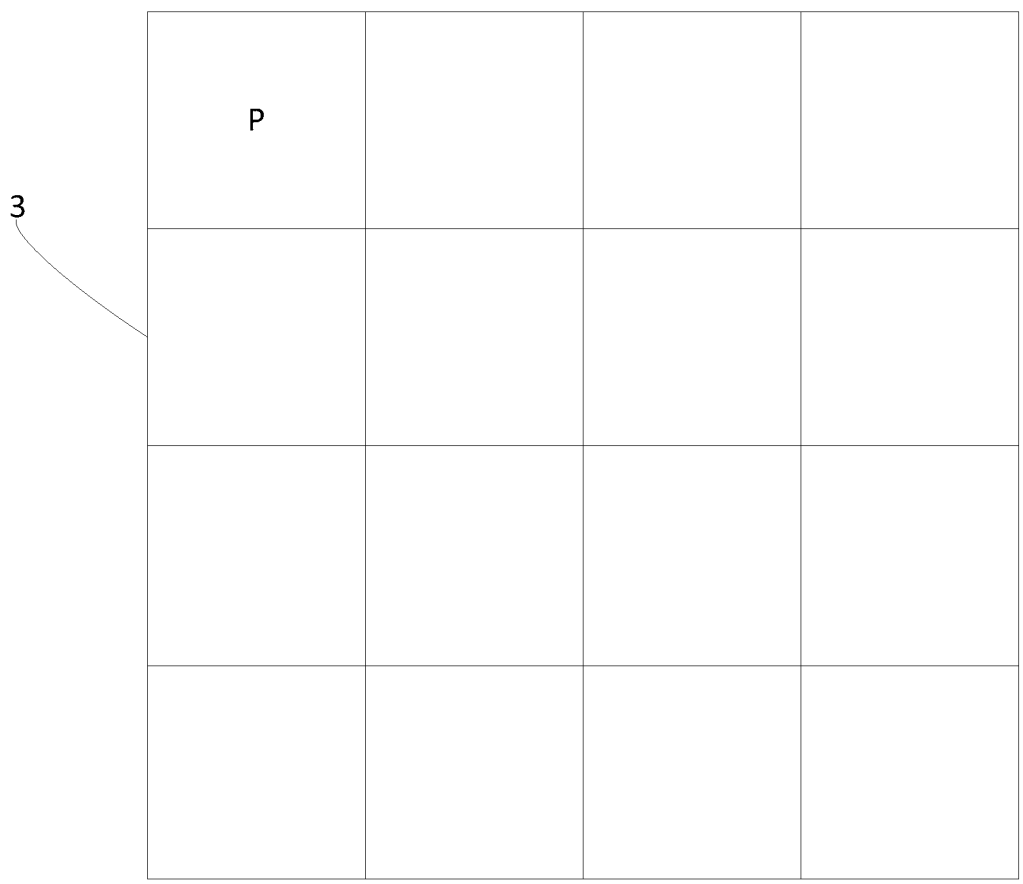
FIG. 13 is a third structural schematic diagram of correspondence of pixel units and a light emitting angle adjustment structure in a display panel according to an embodiment of the present application.

Further, in the specific implementation, the above display panel provided by the embodiments of the present application has pixel units P distributed in an array, as shown in FIGS. 11 to 13.

As shown in FIG. 11, the pixel units P are in one-to-one correspondence with light emitting angle adjustment structures 3, so that light emitting angles of pixel units P in various directions may be controlled in different regions according to display needs, thereby achieving the functions of anti-peep display, wide viewing angle dislay or normal display, and having high display flexibility. Or, as shown in FIG. 12, a plurality of pixel units P correspond to one light emitting angle adjustment structure 3, for example, the left half and right half of the display panel each correspond to one light emitting angle adjustment structure 3. When anti-peep display is needed on the left side, an electrical control material layer of a light emitting angle adjustment structure 3 on the left side is controlled to form a convex lens structure. When anti-peep display is needed on the right side, an electrical control material layer of a light emitting angle adjustment structure 3 on the right side is controlled to form a convex lens structure. When anti-peep display is needed on both the left side and the right side, the electrical control material layers of the light emitting angle adjustment structures 3 on the left side and right side are controlled to form convex lens structures at the same time. Of course, FIG. 12 is only an example of anti-peep display, but not limited to anti-peep display, and may also achieve wide viewing angle display as needed. Or, as shown in FIG. 13, all pixel units P correspond to one light emitting angle adjustment structure 3, so that an electrical control material layer of the light emitting angle adjustment structure 3 corresponding to the entire display panel may be controlled to form a convex lens structure, a concave lens structure or a flat mirror structure, thereby achieving the functions of anti-peep display, wide viewing angle dislay or normal display.

It should be noted that the pixel units P shown in FIGS. 11 to 13 provided by the embodiments of the present application only represent part of the pixel units of the display panel, rather than all the pixel unit structures of the display panel. FIGS. 11 to 13 are only for schematically illustrating a corresponding relationship between the light emitting angle adjustment structure 3 and the pixel units P.

Since an OLED display has the advantages of low energy consumption, low production cost, self-luminescence, wide viewing angle and fast response, the following description takes the display substrate being an OLED display as an example.

Figure 14:
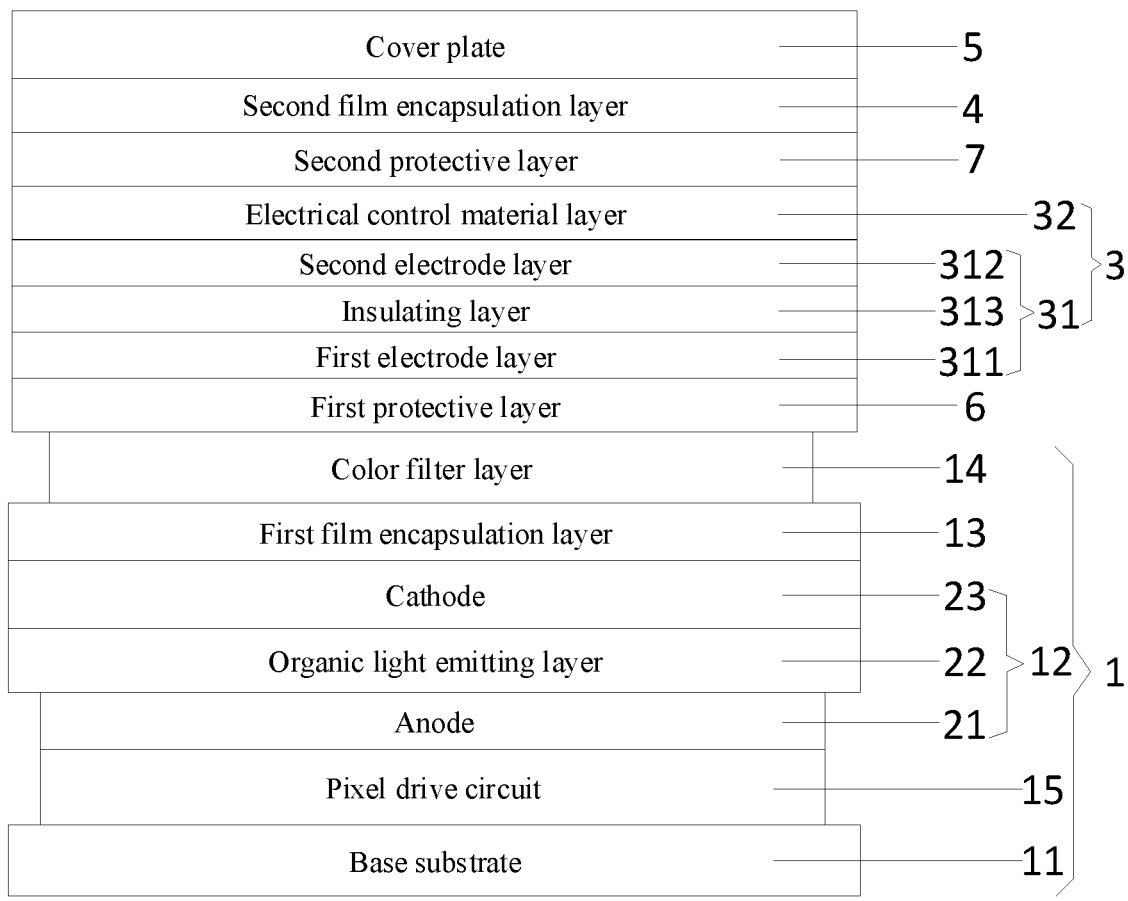
FIG. 14 is a sixth schematic structural diagram of a display panel according to an embodiment of the present application.
Figure 15:
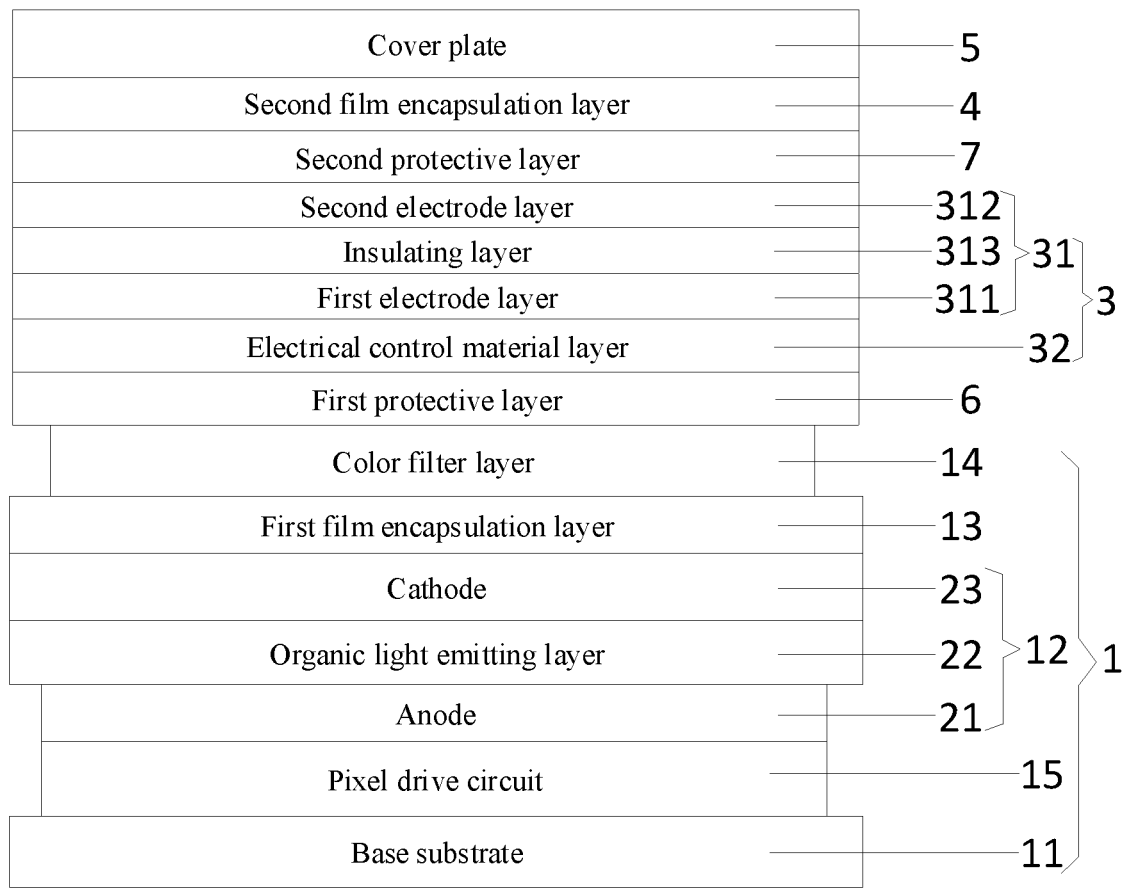
FIG. 15 is a seventh schematic structural diagram of a display panel according to an embodiment of the present application.

Further, in the specific implementation, in the above display panel provided by the embodiments of the present application, as shown in FIG. 14 and FIG. 15, the display substrate 1 includes a base substrate 11 and an organic light emitting device 12 located on the base substrate 11. The organic light emitting device 12 mainly includes an anode 21, an organic light emitting layer 22, and a cathode 23 which are disposed in a laminated manner. The material of the anode 21 may be ITO. The organic light emitting layer 22 is made of an organic material, and emits light under the driving of a voltage or current due to the light emitting characteristic of the organic material.

In the specific implementation, the anode may be located on a side, close to the base substrate, of the organic light emitting layer; or may be located on a side, away from the base substrate, of the organic light emitting layer, which is not limited here.

Further, the organic light emitting device may be a color light emitting device, such as a RGB light emitting device, etc., and of course the organic light emitting device may also be a monochromatic light emitting device. When the organic light emitting device emits white light, as shown in FIG. 14 and FIG. 15, the display substrate 1 further includes a first film encapsulation layer 13 and a color filter layer 14 located on a side, facing the light emitting angle adjustment structure 3, of the organic light emitting device 12. The color filter layer 14 is combined with the organic light emitting layer 22 to realize colorized display of emitted light.

It should be noted that the display panel shown in FIG. 14 and FIG. 15 provided by the embodiments of the present application is illustrated with a combination of a white light OLED and a color film layer.

Further, in the specific implementation, the above first film encapsulation layer is a film layer for preventing the organic light emitting layer from being eroded by water and oxygen. Because the material of the organic light emitting layer is very prone to being corroded by external water and oxygen to destroy the performance of the organic light emitting layer, in order to more effectively prevent the erosion of external water and oxygen, as shown in FIG. 14 and FIG. 15, the above display panel provided by the embodiments of the present application further includes: a second film encapsulation layer 4 located on a side, facing away from the display substrate 1, of the light emitting angle adjustment structure 3; and a cover plate 5 located on a side, facing away from the display substrate 1, of the second film encapsulation layer 4. Specifically, the first film encapsulation layer 13 and the second film encapsulation layer 4 each are a film layer structure which combines an organic material and an inorganic material, so as to effectively prevent the erosion of water and oxygen. The cover plate 5 is made of mother grass with high transmittance. In addition, the second film encapsulation layer 4 and the cover plate 5 may also play a role of protecting the light emitting angle adjustment structure 3 and the color filter layer 14.

Further, in the specific implementation, as shown in FIG. 14 and FIG. 15, the above display panel provided by the embodiments of the present application further includes a first protective layer 6 located between the display substrate 1 and the light emitting angle adjustment structure 3. Specifically, since a certain amount of heat may be generated when a voltage is applied to the electrode structure 31 of the light emitting angle adjustment structure 3, and the heat may damage film layers in the display substrate 1, such as the color filter layer 14. In the embodiments of the present application, the first protective layer 6 is disposed between the color filter layer 14 and the light emitting angle adjustment structure 3 to prevent the color filter layer 14 from being damaged.

Further, in the specific implementation, in order to protect each film layer in the light emitting angle adjustment structure from being affected by subsequent processes, as shown in FIG. 14 and FIG. 15, the above display panel provided by the embodiments of the present application further includes a second protective layer 7 located between the second film encapsulation layer 4 and the light emitting angle adjustment structure 3.

Specifically, the above first protective layer 6 and second protective layer 7 are used as a peripheral support of the light emitting angle adjustment structure 3. The color filter layer 14 is disposed below the first protective layer 6. The electrode structure 31 is disposed above the first protective layer 6. The insulating layer 313 in the electrode structure 31 serves as a medium for electric field discharge.

Further, in the specific implementation, as shown in FIG. 14 and FIG. 15, the above display panel provided by the embodiments of the present application further includes the color filter layer 14 located between the base substrate 11 and the organic light emitting device 12.

Further, in the specific implementation, in the above display panel provided by the embodiments of the present application, the base substrate is a silicon substrate. That is, the display panel provided by the present application is a silicon-based OLED microdisplay. Different from a conventional active matrix/organic light emitting diode (AMOLED) device that uses an amorphous silicon, microcrystalline silicon or low-temperature polysilicon thin film transistor as a backplane, the silicon-based OLED microdisplay device uses a monocrystalline silicon chip as a substrate, has a pixel size $\frac{1}{10}$ that of a traditional display device, and has fineness much higher than that of the traditional display device. The monocrystalline silicon chip adopts an existing mature integrated circuit CMOS process, which not only achieves the active addressing matrix of display pixels, but also achieves driving control circuits with various functions such as an SRAM memory and T-CON on the silicon chip. Therefore, the external wiring of the device is greatly reduced, the reliability is increased, and the weight is reduced. In addition, the structure of the silicon-based OLED microdisplay is simplified, the cost is reduced, the display quality is improved, the special requirements of different viewing angles are met, and a thin and light integrated design may be realized. Silicon-based AMOLED microdisplays have a broad market application space, and are especially suitable for helmet-mounted displays, stereo display mirrors, eye-type displays, etc.

Specifically, the light emitting angle adjustment structure may be integrated above the color filter layer by using a vapor deposition process technology, and in conjunction with the inherent features of the electrical control material layer made of the polycarbonate plexiglass material, the features of good integration degree and small volume are achieved. The light emitting angle adjustment structure may be etched in the silicon-based OLED display device, and thus a display system has a high integration degree.

Further, in the specific implementation, in the above display panel provided by the embodiments of the present application, when the base substrate is the silicon substrate, a pixel drive circuit for driving the organic light emitting device to emit light may be fabricated in the silicon substrate by using the CMOS process. FIG. 14 and FIG. 15 of the embodiments of the present application are only to illustrate the relative positions of the color filter layer 14, the base substrate 11 and the organic light emitting device 12. In the specific implementation, the pixel drive circuit is integrated on the silicon substrate.

Further, in the specific implementation, as shown in FIG. 14 and FIG. 15, the above display panel provided by the embodiments of the present application further includes a drive circuit (not shown in the figure) configured to apply a drive voltage to the electrode structure 31. The drive circuit may be independent of the silicon substrate, or the drive circuit may also be integrated on the silicon substrate.

Based on the same inventive concept, embodiments of the present application further provide a drive method for a display panel. The method includes: applying a voltage to an electrode structure to form an electric field, to enable an electrical control material layer to form a convex lens structure or a concave lens structure under the action of the electric field.

In the drive method for the above display panel provided by the embodiments of the present application, when different voltages are applied to the electrode structure of at least one light emitting angle adjustment structure to form electric fields, in a first aspect, the electrical control material layer of the light emitting angle adjustment structure forms the convex lens structure under the action of the electric fields, the convex lens structure has an effect of concentrating output light, and therefore, the electrical control material layer may decrease a divergence angle of light emitted from the display panel, so as to decrease a viewing angle of a display apparatus, and may achieve anti-peep display. In another aspect, the electrical control material layer of the light emitting angle adjustment structure forms the concave lens structure under the action of the electric fields, the concave lens structure has an effect of dispersing output light, and therefore, the electrical control material layer may increase the divergence angle of the light emitted from the display panel, so as to increase the viewing angle of the display apparatus, and may achieve wide viewing angle display. Moreover, the electrical control material layer is a flat mirror structure when no voltage is applied to the electrode structure of the light emitting angle adjustment structure, thereby achieving a function of normal display.

Further, in the specific implementation, when the electrode structure includes a first electrode layer and a second electrode layer, the above drive method provided by the embodiments of the present application specifically includes the following:

in a narrow viewing angle mode: a voltage is applied to the first electrode layer and the second electrode layer to form a first electric field pointing to a center of the display panel along both sides of the display panel and having a gradually increasing electric field intensity, to enable the electrical control material layer to form the convex lens structure under the action of the first electric field;

in a wide viewing angle mode: a voltage is applied to the first electrode layer and the second electrode layer to form a second electric field opposite to a direction of the first electric field, to enable the electrical control material layer to form the concave lens structure under the action of the second electric field; and in a normal display mode: there is no voltage difference between the first electrode layer and the second electrode layer, for example, no voltage is applied to the first electrode layer and the second electrode layer, and the electrical control material layer is the flat mirror structure.

In the specific implementation, the driving principle of the drive method for the above display panel may be referred to the driving principle described in the above display panel embodiments, which will not be repeated here.

Based on the same inventive concept, an embodiment of the present application further provides a display apparatus. The display apparatus includes the above display panel provided by the embodiments of the present application. The principle of the display apparatus to solve problems is similar to that of the above display panel, and therefore, the implementation of the display apparatus may be referred to the implementation of the above display panel, which will not be repeated here.

Figure 16:
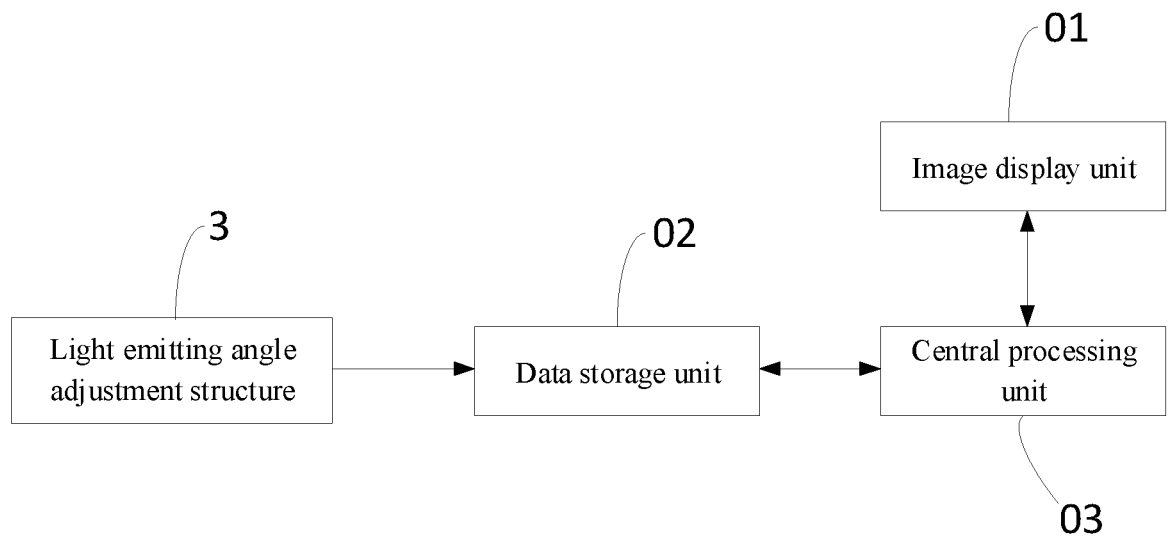
FIG. 16 is a schematic structural diagram of a display apparatus according to an embodiment of the present application.

In the specific implementation, as shown in FIG. 16, the display apparatus provided by the embodiment of the present application further includes: an image display unit 01, a data storage unit 02, and a central processing unit 03. The central processing unit 03 is connected with the data storage unit 02 and the image display unit 01. The central processing unit 03 is a control center of a silicon-based OLED display apparatus, and may send action commands to control actions of image display and small-viewing-angle control. The data storage unit 02 is connected to a light emitting angle adjustment structure 3 to transmit data voltages which drive an electrical control material layer to deform, and store signal data of voltages which drive the electrical control material layer, that is, the data storage unit 02 achieves the functions of transmission and storage of voltage information. The image display unit 01 achieves display of images and video pictures of the silicon-based OLED display apparatus. Specifically, the central processing unit 03 sends a control command, and the control command is transmitted via the data storage unit 02 to drive the image display unit 01 to display images and video signals. At the same time, the central processing unit 03 sends a voltage driving control command to drive the light emitting angle adjustment structure 3 as a convex lens, a concave lens or a flat mirror, to display and transmit a virtual image of pixels to the outside. Therefore, the silicon-based OLED display apparatus achieves the function of displaying images and adjusting a light emitting angle, the stereo display effect of images is enhanced, and the experience and immersion of VR/AR users may be improved.

According to the display panel, the drive method therefor, and the display apparatus provided by the embodiments of the present application, by providing the at least one light emitting angle adjustment structure on the light emitting side of the organic light emitting device, when the electric field is formed by applying different voltages on the electrode structure of the at least one light emitting angle adjustment structure, in a first aspect, the electrical control material layer of the light emitting angle adjustment structure forms the convex lens structure under the action of the electric field, the convex lens structure has the effect of concentrating output light, and therefore, the electrical control material layer may decrease the divergence angle of the light emitted from the display panel, so as to decrease the viewing angle of the display apparatus, and may achieve anti-peep display. In another aspect, the electrical control material layer of the light emitting angle adjustment structure forms the concave lens structure under the action of the electric field, the concave lens structure has the effect of dispersing output light, and therefore, the electrical control material layer may increase the divergence angle of the light emitted from the display panel, so as to increase the viewing angle of the display apparatus, and may achieve wide viewing angle display. Moreover, the electrical control material layer of the light emitting angle adjustment structure is the flat mirror structure when there is no action of an electric field, thereby achieving the function of normal display. Therefore, the display panel provided by the embodiments of the present application can realize the adjustable light emitting angle of display while displaying images, to enhance the stereo display effect of images, and improve the immersion and experience of users, thereby achieving a high-quality near-to-eye display effect.

It will be apparent to those skilled in the art that various modifications and variations can be made in the present application without departing from the spirit or scope of the present application. Thus, it is intended that the present application cover the modifications and variations of the present application provided they come within the scope of the appended claims of the present application and their equivalents.

What is claimed is:

1. A display panel, comprising:
   a display substrate, and
   at least one light emitting angle adjustment structure arranged on a light emitting side of the display substrate;
   wherein the at least one light emitting angle adjustment structure comprises an electrode structure and an electrical control material layer which are disposed in a laminated manner;
   wherein the electrical control material layer is configured to form a convex lens structure or a concave lens structure under an action of an electric field, and is of a flat mirror structure when there is no electric field; and
   the electrode structure is configured to form the electric field when a voltage is applied, to enable the electrical control material layer to form the convex lens structure or the concave lens structure under the action of the electric field;
   wherein the electrode structure comprises a first electrode layer, an insulating layer, and a second electrode layer which are disposed in a laminated manner;
   wherein the electrode structure is arranged on a side, close to the display substrate, of the electrical control material layer; or
   the electrode structure is arranged on a side, away from the display substrate, of the electrical control material layer.

2. The display panel according to claim 1, wherein a material of the electrical control material layer comprises polycarbonate plexiglass, polyvinylidene fluoride or an electrowetting material.

3. The display panel according to claim 1, wherein the first electrode layer is a planar electrode, and the second electrode layer comprises a plurality of independently disposed block electrodes; or,
   the first electrode layer comprises a plurality of independently disposed block electrodes, and the second electrode layer is a planar electrode; or,
   the first electrode layer and the second electrode layer each comprise a plurality of independently disposed block electrodes.

4. The display panel according to claim 1, comprising pixel units distributed in an array; wherein
   each one of the pixel units is in one-to-one correspondence with a respective one of the at least one light emitting angle adjustment structures, or
   a plurality of the pixel units correspond to one of the at least one of the light emitting angle adjustment structures, or
   all the pixel units correspond to the one light emitting angle adjustment structure.

5. The display panel according to claim 1, wherein the display substrate comprises a base substrate and an organic light emitting device arranged on the base substrate;
   wherein the organic light emitting device comprises an anode, an organic light emitting layer, and a cathode which are disposed in a laminated manner.

6. The display panel according to claim 5, further comprising:
   a second film encapsulation layer arranged on a side, facing away from the display substrate, of the at least one light emitting angle adjustment structure, and
   a cover plate arranged on a side, facing away from the display substrate, of the second film encapsulation layer.

7. The display panel according to claim 6, further comprising a first protective layer arranged between the display substrate and the at least one light emitting angle adjustment structure.

8. The display panel according to claim 6, further comprising a second protective layer arranged between the second film encapsulation layer and the at least one light emitting angle adjustment structure.

9. The display panel according to claim 5, wherein the base substrate is a silicon substrate.

10. The display panel according to claim 9, further comprising a drive circuit configured to apply a drive voltage to the electrode structure;
    wherein the drive circuit is independent of the silicon substrate, or the drive circuit is integrated in the silicon substrate.

11. A display apparatus, comprising the display panel according to claim 1.

12. A drive method for the display panel according to claim 1, comprising:
applying the voltage to the electrode structure to form the electric field, to enable the electrical control material layer to form the convex lens structure or the concave lens structure under the action of the electric field.

13. The drive method according to claim 12, wherein the drive method comprises:
in a narrow viewing angle mode: applying a voltage to the first electrode layer and the second electrode layer to form a first electric field pointing to a center of the display panel along both sides of the display panel and having a gradually increasing electric field intensity, to enable the electrical control material layer to form the convex lens structure under the action of the first electric field;
in a wide viewing angle mode: applying a voltage to the first electrode layer and the second electrode layer to form a second electric field opposite to a direction of the first electric field, to enable the electrical control material layer to form the concave lens structure under the action of the second electric field; and
in a normal display mode: applying no voltage difference between the first electrode layer and the second electrode layer, wherein the electrical control material layer is a flat mirror structure.

14. The display panel according to claim 4, wherein:
when each one of the pixel units is configured in one-to-one correspondence with the respective one of the at least one of the light emitting angle adjustment structures, the pixel units are divided into a plurality of regions and the corresponding light emitting angle adjustment structure is configured to control light emitting angles of the pixel units in each of the plurality of regions; or
when a plurality of the pixel units correspond to one of the at least one of the light emitting angle adjustment structures, the pixel units are divided into different regions corresponding to different light emitting angle adjustment structures and the electrical control material layer of each of the light emitting angle adjustment structures corresponding to the pixel units in each different region where anti-peep display is needed is configured to form the convex lens structure, the concave lens structure, or the flat mirror structure; or
when all the pixel units correspond to the one light emitting angle adjustment structure, the electrical control material layer of the one light emitting angle adjustment structure corresponding to all the pixel units is configured to form the convex lens structure, the concave lens structure, or the flat mirror structure.

15. The display panel according to claim 5, wherein the display substrate further comprises a first film encapsulation layer and a color filter layer located on a side, facing the at least one light emitting angle adjustment structure, of the organic light emitting device.

16. The display panel according to claim 15, further comprising:
a second film encapsulation layer arranged on a side, facing away from the display substrate, of the at least one light emitting angle adjustment structure, and
a cover plate arranged on a side, facing away from the display substrate, of the second film encapsulation layer.

17. The display panel according to claim 16, further comprising a first protective layer arranged between the color filter layer and the at least one light emitting angle adjustment structure.

18. The display panel according to claim 16, further comprising a second protective layer arranged between the second film encapsulation layer and the at least one light emitting angle adjustment structure.

19. The display panel according to claim 1, wherein:
in a narrow viewing angle mode: the electrical control material layer is enabled to form the convex lens structure under an action of a first electric field by applying a voltage to the first electrode layer and the second electrode layer to form the first electric field pointing to a center of the display panel along both sides of the display panel and having a gradually increasing electric field intensity;
in a wide viewing angle mode: the electrical control material layer is enabled to form the concave lens structure under an action of a second electric field by applying a voltage to the first electrode layer and the second electrode layer to form the second electric field opposite to a direction of the first electric field; and
in a normal display mode: the electrical control material layer is of the flat mirror structure by maintaining no voltage difference between the first electrode layer and the second electrode layer.

20. The display panel according to claim 17, wherein the first protective layer is configured to protect the color filter layer from being damaged by heat when the voltage is applied to the electrode structure of the at least one light emitting angle adjustment structure.

* * * * *